United States Patent [19]

Trinh

[11] Patent Number: 5,125,111
[45] Date of Patent: Jun. 23, 1992

[54] RESISTIVE PLANAR RING DOUBLE-BALANCED MIXER

[75] Inventor: Trang N. Trinh, Cypress, Calif.

[73] Assignee: Rockwell International Corporation, Seal Beach, Calif.

[21] Appl. No.: 576,755

[22] Filed: Sep. 4, 1990

[51] Int. Cl.$^5$ .......................... H04B 1/26; H01P 5/10
[52] U.S. Cl. .................................. 455/327; 455/328; 455/330; 333/26
[58] Field of Search ...................... 455/323, 325–328, 455/330; 333/24 R, 25, 26, 238, 246

[56] References Cited

U.S. PATENT DOCUMENTS

| | | | |
|---|---|---|---|
| 4,553,266 | 11/1985 | Bates et al. | 455/327 |
| 4,739,519 | 4/1988 | Findley | 455/327 |
| 4,755,775 | 7/1988 | Marczewski et al. | 333/26 |

OTHER PUBLICATIONS

*Broadband Double Balanced Mixer/Modulators* Part I R. B. Mouw and S. M. Fukuchi, The Microwave Journal, vol. 12, No. 3, Mar. 1969, pp. 131–134.
*Decade–Band Mixer Covers 3.5 to 35 GHz* M. A. Smith, K. J. Anderson, and A. M. Pavio, The Microwave Journal, vol. 29, No. 2, Feb. 1986, pp. 163–171.
Broadband Double Balanced Mixer/Modulators, R. B. Mouw and S. M. Fukuchi, Aertech, *The Microwave Journal*, Mar. 1969, pp. 131–134.

*Primary Examiner*—Reinhard J. Eisenzopf
*Assistant Examiner*—Chi H. Pham
*Attorney, Agent, or Firm*—H. Fredrick Hamann; George A. Montanye; Gregory D. Ogrod

[57] ABSTRACT

A passive uniplanar double-balanced RF mixing apparatus, comprising a planar support substrate with first and second conductive layers disposed on first and second sides, and first and second linear slotlines having open terminations on a first end thereof formed in the first conductive layer. First and second coplanar waveguides are also formed in the first conductive layer with each having one end electrically coupled to first and of said first and second slotlines, respectively. A first balun comprises the first coplanar waveguide connection to the first slotline, and a second balun comprises the second coplanar waveguide connection the second slotline. An isolation gap formed in the first conductive layer adjacent to and between the first and second slotlines provided electrical isolation between the first and second baluns and waveguides for RF-toLO isolation. A transfer element, in the form of a third coplanar waveguide or a conductive via, is electrically connected to one of the baluns adjacent to, but removed a predetermined distance from, the associated slotline for transferring intermediate oscillator frequency signals. A folded diode ring is connected between the slotlines and to the first and second baluns.

23 Claims, 5 Drawing Sheets

RESISTIVE PLANAR RING DOUBLE-BALANCED MIXER

BACKGROUND OF THE INVENTION

1. Field of the Invention

The present invention relates to radio frequency transmission and reception circuits and radio frequency mixers, and more particularly to an apparatus for mixing intermediate radio, or other very high frequency signals with local oscillator signals in a double-balanced ring mixer on a planar substrate. The invention further relates to a ring-type double-balanced mixer for performing very high radio frequency mixing in a uniplanar monolithic integrated circuit.

2. Related Technical Art

A variety of Radio Frequency (RF) mixers have been developed to provide facility for combining a local reference oscillator output with either an intermediate frequency source or a desired radio frequency source for either up or down conversion. Mixers form the key link between antennas and associated processing or decoding circuits. In many applications, such as for advanced Monolithic Microwave Integrated Circuits (MMICs), the desire is to greatly reduce the size of mixers and related processing components to meet volumetric limitations otherwise addressed by MMIC elements and to also minimize power consumption.

One mixer configuration finding use in planar applications is the ring Double Balanced Mixer (DBM) which allows more flexibility in component interconnection. An example of this type of mixer is found in the article "Broadband Double Balanced Mixer/Modulators" by R. B. Mouw and S. M. Fukuchi, published in the Microwave Journal, pages 133-134, March 1969. Currently, most MMIC type DBMs utilize Field-Effect Transistors (FETs) and lumped-element baluns due to the difficulty in realizing a microwave balun to feed a planar ring of four Schottky diodes. Unfortunately, this type of mixer usually exhibits a narrow bandwidth due to elaborate matching requirements and is also relatively unstable due to temperature variations.

To create a broadband mixing structure requires the use of active baluns having several FETs in a distributed configuration. This configuration is generally large in size, compared to conventional MMIC components, and requires large DC power supplies. FET active baluns also introduce additional noise into MMIC double-balanced mixers which degrades their performance.

Current designs for passive planar double-balanced mixers also require fabricating the Schottky diodes and other circuit elements on both sides of a support/base substrate. The assembly is then inserted into a waveguide channel for operation. This type of construction makes this type of mixer unsuitable for uniplanar or true monolithic integrated circuit applications.

What is needed is an apparatus or technique for reducing the areal, packaging, and power requirements for a double-balanced RF mixer. It would be extremely advantageous if the apparatus can be manufactured using known monolithic circuit fabrication techniques such as employed in conventional MMIC applications. The apparatus should provide low loss, MMIC compatible operation.

SUMMARY

In view of the limitations and problems in the art, it is one purpose of the present invention to provide an RF signal mixer structure capable of being manufactured as a uniplanar monolithic component.

One advantage of the present invention is that it provides highly compact and non-complex monolithic mixer structures capable of being manufactured on a large scale using conventional techniques.

Another advantage of the present invention is that it operates over a large bandwidth.

The invention provides a double-balanced mixer configuration with a uniplanar design and its associated advantages.

These and other purposes, objects, and advantages of the invention are realized in a passive uniplanar double-balanced ring-type mixer comprising a planar support substrate with conductive material layers disposed on first and second, opposing, surfaces. The second surface layer acts as a ground plane for the mixer. First and second narrow slotline conductors are formed in the first conductive layer, generally in a central location. A first coplanar waveguide (CPW) is formed in the first conductive layer with one end coupled to one end of the first slotline conductor, being configured to transfer signals in a first predetermined frequency range to or from the first slotline. A second coplanar waveguide is also formed in the first conductive layer with one end coupled to one end of the second slotline and being configured to transfer signals in a second frequency range to or from the slotline. A quad ring of diodes is connected between the two slotlines at their respective second ends.

At the transition between each slotline and coplanar waveguide pair, the respective first or second slotline is terminated by an open circuit, generally in the form of a large circular opening. This termination provides for efficient electromagnetic coupling between the two types of transmission lines. This transition is also called a "balun" (balanced-to-unbalanced) which is usually needed in a DBM.

A first coplanar waveguide-to-slotline balun is formed in the first conductive layer between the first coplanar waveguide as an unbalanced line, and the first open end of the slotline as a balanced line, to transfer a first preselected frequency range of signals to the diodes via a short section of the first slotline. A second coplanar waveguide-to-slotline balun is also formed in the first conductive layer between the second coplanar waveguide and the first end of the second slotline to transfer a second frequency range of signals to the diodes via that short section of slotline. An isolation region or element is formed in the first conductive layer adjacent to and between the slotlines where the diodes are located to provide electrical isolation between the two baluns and, hence, the two input signals.

The local oscillator (LO) signal is introduced into one of the coplanar waveguides and transferred from the unbalanced line to the slotline through the coplanar waveguide-to-slotline balun. The radio frequency (RF) signal is applied to the other coplanar waveguide input and transferred to the slotline through the second balun. The two waveguides are generally positioned on opposite sides of the mixer circuit or substrate surface area.

The quad ring of diodes is formed a junction between the first and second slotlines and comprises first, second, third, and fourth diodes connected to form a folded ring diode bridge. In the folded ring, the first diode is connected at its anode to the first slotline conductor near the first waveguide-to-slotline transition or balun and at its cathode to the second slotline adjacent to the other balun. The second diode is connected at its anode to the second slotline near the second balun and at its cathode to the first slotline adjacent to the first balun. The third diode is connected at its anode to the first slotline adjacent to the first balun and at its cathode to the second slotline conductor near the second balun. The fourth diode is connected at its cathode to the first slotline adjacent to the first balun and at its anode to the second slotline near the second balun.

In further aspects of the invention, the isolation region comprises a break or isolation gap in the first conductive layer between the first and second waveguides, and the two baluns associated with the waveguides. The waveguide-to-slotline transitions are typically accomplished using small air bridge connectors or gold ribbons. The open terminations for the slotlines comprise circular openings of predetermined radius formed in the first conductive layer. The substrate comprises gallium arsenide or an insulating material such as sapphire or a ceramic.

In one embodiment, the first coplanar waveguide comprises an input/output port for RF signals, the second coplanar waveguide is an input port for local oscillator frequency signals, and intermediate frequency (IF) output is achieved through a transfer element, such as conductive ribbon or via, connected to both the second and first baluns, preferably adjacent to the large circular open terminations of each slotline conductor. Since the DBM is electrically symmetrical, the RF and LO ports are interchangeable.

In an alternate embodiment, the second conductive layer for the ground plane is eliminated. The transfer element for IF signals comprises a third coplanar waveguide formed in the first conductive layer with the center conductor electrically connected to the center tap of one balun, and the IF coplanar waveguide ground electrically connected to the center tap of the second balun. In this configuration, both conductive surfaces surrounding each slotline are physically connected and have the same potential at IF frequencies. However, at RF and LO frequencies, these two conductive surfaces carry opposite charges. Therefore, the two conductive surfaces of each slotline form the center tap of a balun.

The impedances of each coplanar waveguide can be maintained by varying the center conductor width to gap ratio. At the input/output ports, the widths of the coplanar waveguides are widened for simple interfacing with coaxial connectors. A plurality of electrically conductive crossovers, such as gold ribbons, are usually connected between the ground surfaces of the coplanar waveguides and span the waveguides to ensure proper ground potential and continuity across the waveguides.

The apparatus is typically manufactured by providing a suitable semiconductor or insulating substrate on which conductive materials such as gold, are deposited to form slotline conductors and coplanar waveguides. The linear slotlines and open transitions are formed in a central portion of the conductive material using conventional techniques, such as chemical or reactive gas etching. The coplanar waveguides are similarly formed adjacent to the slotline conductors. Isolation passages are etched in the metal to provide the separation of the metal layer into the first and second baluns. The diodes are positioned at the break between the slotlines, across the isolation gap, to form a complete DBM. The diode are either discrete components soldered or affixed in place, or material deposited to produce diode structures.

BRIEF DESCRIPTION OF THE DRAWINGS

The novel features of the present invention may be better understood from the accompanying description when taken in conjunction with the accompanying drawings in which.

DESCRIPTION OF PREFERRED EMBODIMENTS

The present invention provides a method and apparatus for constructing a high frequency double-balanced mixer. The mixer of the present invention comprises a uniplanar passive double-balanced mixer that is suitable for hybrid or monolithic microwave integrated circuit applications. Two coplanar waveguide-to-slotline baluns are combined with a "folded" quad diode ring to form a ring-type double-balanced mixer. The conventional diode ring is folded so that Radio Frequency (RF) and Local Oscillation (LO) signal sources can be designed and laid-out independently of each other. The coplanar waveguide-to-slotline baluns replace conventional coiled transformers and the center tap for extraction of Intermediate Frequency (IF) signals is realized by connecting between the conductive surfaces of the slotline. The mixer is uniplanar, that is, all of the circuit components reside on a single side of the substrate.

Figure 1:
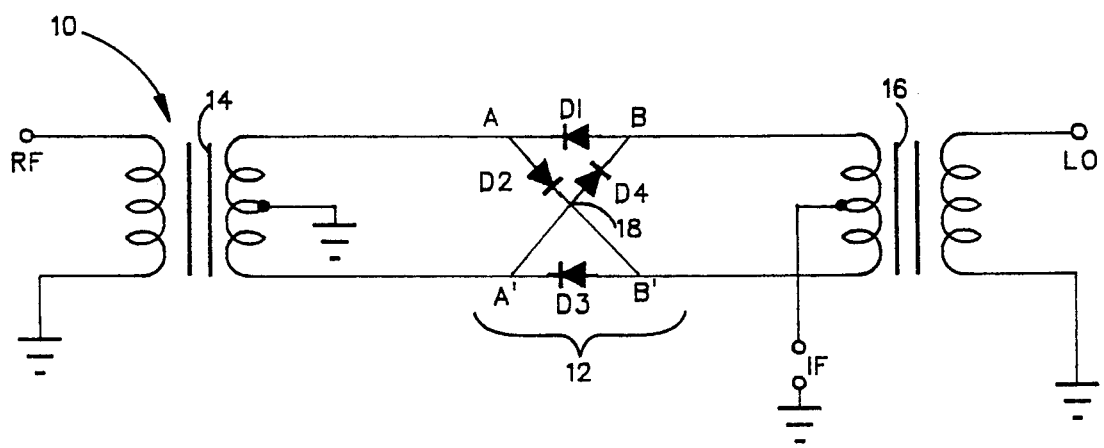
FIG. 1 illustrates a schematic of a double-balanced mixer circuit found useful in constructing the present invention.

FIG. 1 shows a schematic of a typical Double-Balanced Mixer (DBM) with a folded diode ring. The DBM 10 uses four diodes, D1, D2, D3, and D4, to form a diode ring 12 between two transformers 14 and 16. By folding the diode ring in a conventional DBM, the DBM of FIG. 1 allows the RF and LO circuits and sources to be designed and laid-out independently of each other. The folded ring crossover 18 created by the diodes D2 and D4, is easily realized using fine wire jumpers or ribbons. The crossover 18 can also be realized by a conductive air or dielectric-supported bridge using MMIC fabrication techniques.

While the circuit of FIG. 1 serves some applications adequately, it is very impractical for many desired MMIC applications. Therefore, the present invention provides a new DBM structure in which planar baluns replace the conventional coiled transformers 14 and 16. This new structure utilizes coplanar waveguides and slotline conductors to perform the input/output and mixing functions of the DBM.

Figure 2:
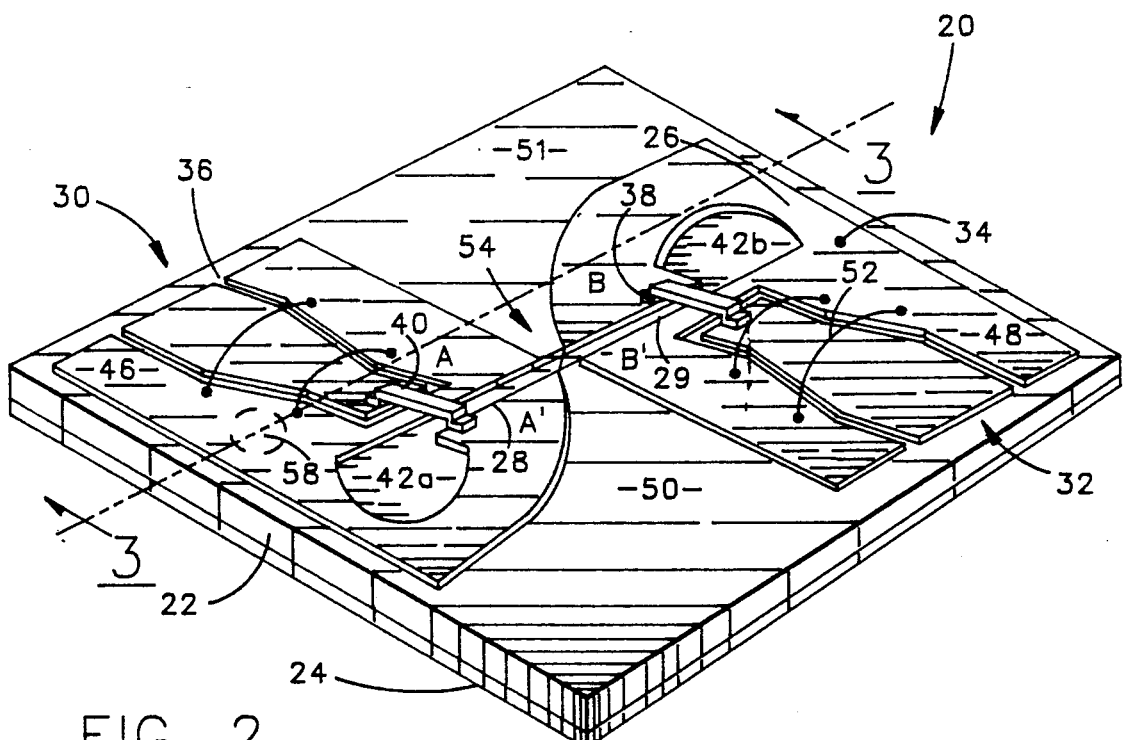
FIG. 2 illustrates a perspective view of a double-balanced ring mixer as constructed according to the present invention.
Figure 3:
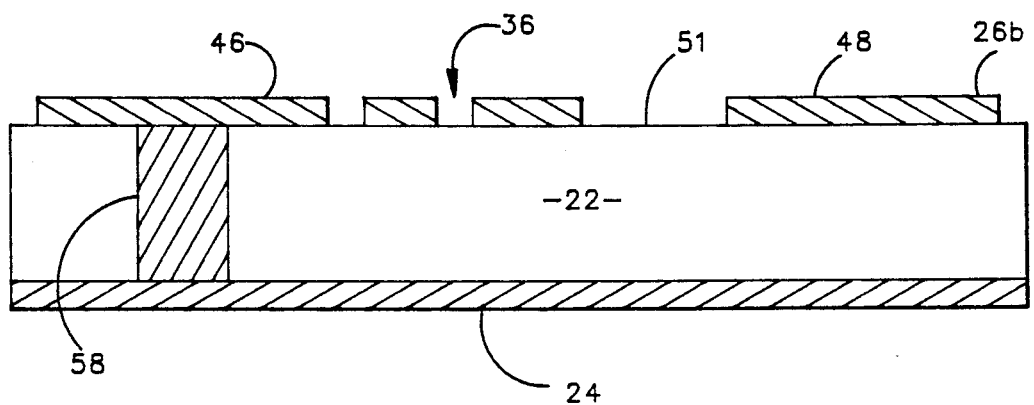
FIG. 3 illustrates a side view of the mixer of FIG. 2 taken along the line 3—3 in FIG. 2.

A double-balanced mixer 20 constructed according to the teachings of the present invention is illustrated in the perspective view of FIG. 2 and side view of FIG. 3.

In FIGS. 2 and 3, a base support or circuit substrate 22 is shown on which the mixer structure is manufactured. The planar substrate 22 comprises one of a variety of suitable semiconductor or insulating materials that are compatible with the fabrication process chosen for mixer construction. The substrate 22 material is also chosen with the manufacture of other MMIC type components and circuit elements in mind, i.e. use of doping, implantation, etc., so that a common substrate can be employed for a larger monolithic architecture. This allows manufacture of the mixer 20 as an integral part of larger monolithic circuits, or using a common processing methodology.

An exemplary substrate material is GaAs. However, those skilled in the art will readily appreciate that other semiconductor or insulating materials such as, but not limited to, silicon, sapphire, ceramic may be used within the teachings of the present invention for the manufacture of the substrate 22. The dimensions of the substrate 22 are obviously determined by the required voltage isolation and standoff requirements for metallic conduction path or ground layers, amount of circuitry to be integrated with the mixer 20, the mixer dimensions required to accommodate a frequency range of interest, application specific size constraints, and other known criteria.

A thin layer of metal or conductive material 24 is deposited on one side of the substrate 22 and generally forms a ground plane for the mixer 20. A metallic material layer 24 is also useful for securing the mixer 20 to a housing, such as through soldering. A second conductive layer of metal or metallization 26, is deposited on a second, opposing, side of the planar substrate 22. Those skilled in the art will readily appreciate that the substrate 22 can itself comprise several material layers and that the ground layer 24 can be positioned within a multi-layer structure where desired.

The conductive or metal layers 24 and 26 can comprise a variety of materials known to those skilled in the art. The conductive layers 24 and 26 typically comprise a material such as silver, chrome/gold alloy, or gold, although other materials are also suitable. The layer 24 can also comprise a conductive composite or conductive material embedded in non-metallic material such as an epoxy which is used to form a structural addition to the substrate 22. Those skilled in the art will readily understand the dimensions, thickness, required for the layers 24 and 26 to achieve desirable impedances and inductances for given applied voltages at the frequencies of interest.

The conductive or metal layer 26 has two slotline conductors 28 and 29 etched, or otherwise formed during metal deposition, centrally located on the substrate 22 surface. The location need not be precisely centered but is illustrated as fairly close to center in this embodiment due to the presence of other circuit features, as well as distances required for establishing appropriate circuit isolations. The locations of the slotlines 28 and 29 are dependent upon such parameters as the desired operating frequency range which determines their size, the dimensions required for adjacent components and waveguides including the baluns discussed below, and area constraints placed on the metal layer 26 by a specific application.

The widths of the slotlines 28 and 29 are determined by the desired impedance value of the lines to accommodate a preselected operating frequency, or frequency range, for the mixer 20, as would be readily apparent to those skilled in the art. An exemplary dimension which is applicable to frequencies between about 1 and 40 GHz, is on the order of 25 $\mu$m in width on a GaAs substrate which is about 140 $\mu$m thick. However, this dimension can be adjusted accordingly, especially where optimization for fixed frequency applications is desired so as to minimize reflection and other degrading effects.

Two coplanar waveguides 30, and 32 are also provided in the metal layer 26. They are used for RF and LO signal transfer and are electrically coupled to the slotlines 28 and 29, respectively. Conductive surface area 48 in general, and location 34 in particular, can be used for tapping off or transferring desired IF signals. A conductive via, 58, connects metal surface area 46 to metal layer 24 for IF ground. It is desirable that the locations of point 34 and via 58 be close to the slot openings 42, especially at higher IF frequencies. The coplanar waveguides 30 and 32, and via structure 58, are formed during deposition or subsequent processing of the metallic material forming the metal layer 26.

Exemplary fabrication techniques for the waveguides include surface masking to prevent or preferentially direct metal deposition, or post deposition etching of gaps or slots 36. The separation between the center strip or conductor and the lateral ground determines the impedance of a coplanar waveguide. The impedance of the coplanar waveguides are determined by the ratio of the width of the center conductor and the gap to the lateral grounds on both sides of the conductor.

Typical dimensions of a 50 ohm coplanar waveguide on a 140 $\mu$m thick GaAs substrate are about 40 $\mu$m for the center conductor width and 30 $\mu$m for the gap 36. This combination is not unique and many other combinations of width and gap dimensions can be chosen for the same impedance level, as will be apparent to those skilled in the art. However, the present apparatus is fairly broadband in nature and does not require physical readjustment for efficient use at frequencies within a preselected broad design envelope.

In FIG. 2, the coplanar waveguide signal feeds, 30 and 32, terminate on one end adjacent an outer edge of the mixer substrate 22. This allows a terminal position for connecting external signal sources through bond wires, ribbons, or small coaxial connectors. The widths of the coplanar waveguides are shown as being widened for simple interfacing with coaxial connectors. Of course, the waveguides can be connected more directly to other components on a larger monolithic circuit structure by extension of the waveguide conductors or through interfacing with other planar conductive strips.

In FIG. 2, the waveguides 30 and 32 are positioned on opposite edges of the substrate 20 to provide maximum signal isolation and to avoid any crowding of interface connectors. However, such opposing placement is not critical and the coplanar waveguides can be positioned along the same edge of the substrate 20 if surface area is limited or at a premium.

The ends of the waveguides positioned on the interior portions of the substrate 22 are coupled electrically to the slotlines 28 and 29 so that signals are fed into and removed from this region of the mixer 20. One waveguide, here 30, introduces RF signals at one end of the slotline 28, and the other waveguide, here 32, introduces signals at an opposite end of the slotline 29 positioned away from the slotline 28. The signals travel along the slotlines 28 and 29 toward the junction of the two slotlines where the diodes reside. These waveguides are coplanar and require no specialized isolation structures other than gaps in the surface metal 26.

Figure 4:
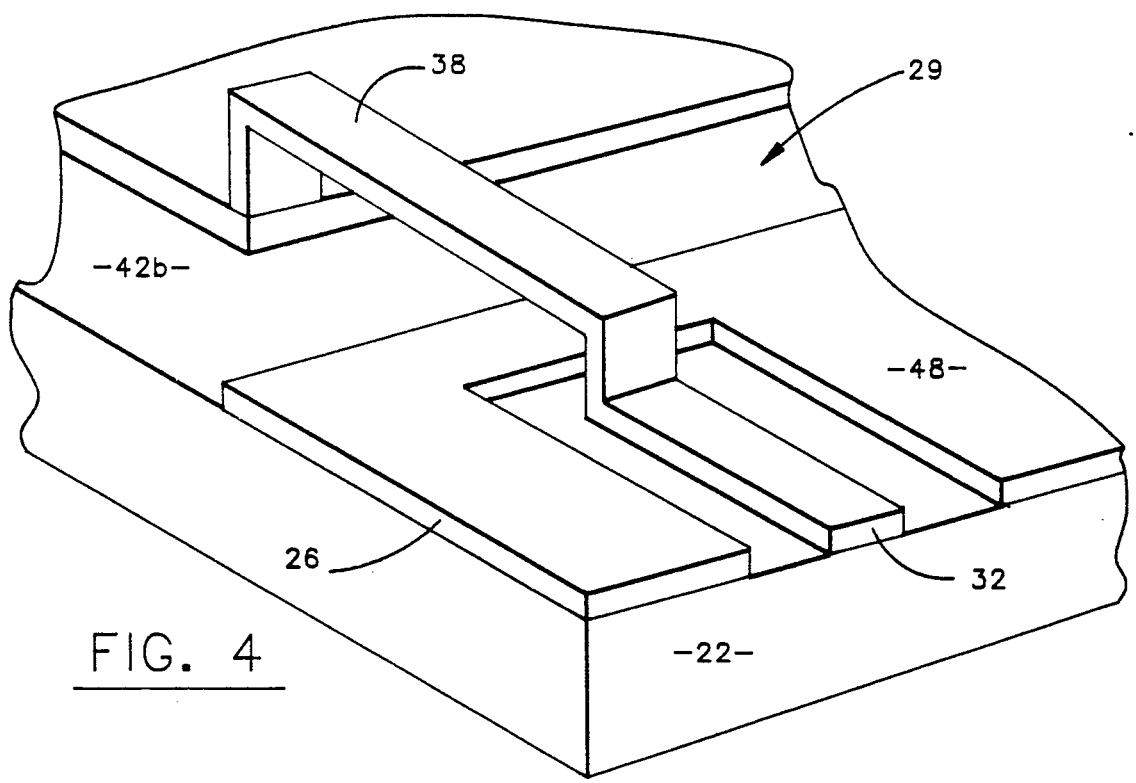
FIG. 4 illustrates a close up perspective view of a balun being used in the mixer of FIG. 4.

The waveguides 30 and 32 are electrically coupled to the slotlines 28 and 29, respectively, using air bridges, ribbons, or wires which bridge the slotlines 28 and 29 at appropriate end locations. An air bridge type connection is preferred because of the ability to manufacture this structure during overall monolithic circuit construction using conventional semiconductor fabrication techniques. The air bridge type connection also improves reliability and reproducibility problems by eliminating flexible structures and manual construction. A typical air bridge type connection is shown in FIG. 2 and in a more detailed sectional view in FIG. 4 which depicts a coplanar waveguide-to-slotline balun.

The linear slotlines 28 and 29 are terminated on each end by an open slotline 42a and 42b, respectively. That is, instead of extending each slotline 28 or 29 for a specified length of approximately a quarter of a wavelength or terminating it with a preselected impedance component, it is terminated into one of the circular regions 42 which, in effect, provide open termination of the slotlines. This provides an open circuit at the end of each slotline for broadband and low loss transition between each coplanar waveguide and an associated slotline.

Figure 5:
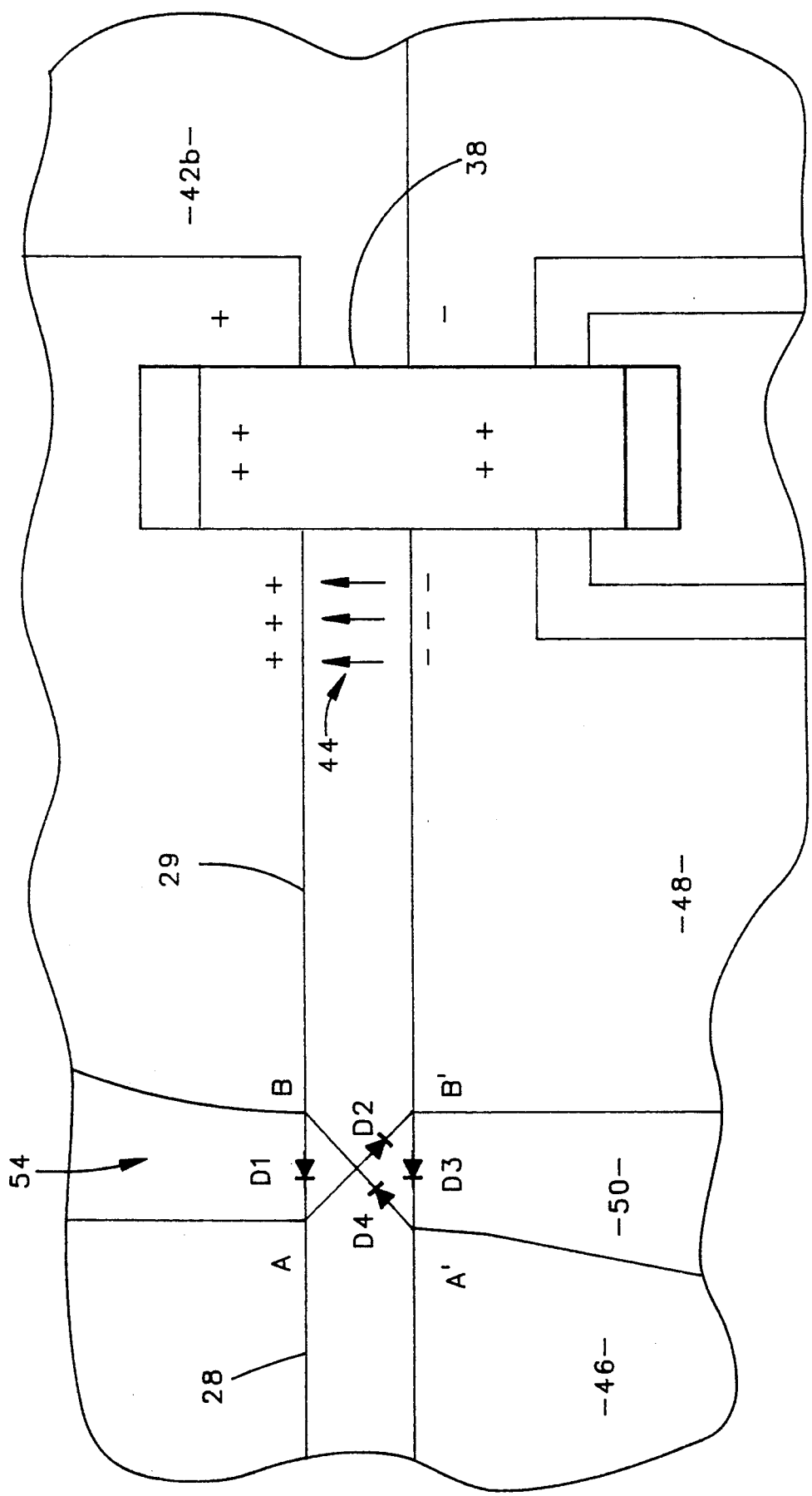
FIG. 5 illustrates a close up sectional view of a diode bridge used in the mixer of FIG. 2.

As shown in FIG. 5, the signals presented along the waveguides 30 and 32 interact with the slotlines 28 and 29, and launch electromagnetic waves 44 along the slotlines, shown extending between the sidewalls of the slotline 29. This is represented in FIG. 5 by the presence of positive and negative charges along the sides of the slotline 29 as deposited by the signals imposed on the slotline 29 by the coplanar waveguide 32. The relative magnitude and exact position of charges and wavefronts are not illustrated but only their relative presence. The charge pattern is determined by the signals being presented to the sidewalls by the waveguide outputs on the air bridges 38 and 40, and the relative transit times through the conductive material of layer 26, area 48.

FIG. 2 shows the use of a coplanar waveguide-to-slotline balun. The coplanar waveguide is an unbalanced line similar to coaxial cables or conductors while the slotline is a balanced structure in the same manner as a parallel-wire line. The transition from a coplanar waveguide (CPW) to a slotline, then, is a balun. Combining the two CPW-to-slotline baluns associated with the waveguides 30 and 32, with a folded ring diode bridge 54 forms the planar DBM shown in FIG. 2.

The open areas 50 and 51 on the substrate 22 provide the required electrical isolation between the baluns and between the waveguides. The separation of the baluns created around the air bridges 38 and 40 are tailored in the region of the slotlines 28 and 29 to be small enough to allow propagation of the desired signals along the length of the slotlines 28 and 29. The slotlines should be made as short as practical to minimize circuit size. Typically the slotline length is on the order of 0.125 times the wavelength of interest or less. The break between slotlines 28 and 29 is dictated by the size of the quad diode ring 54. The diode ring 54 should fit inside of the area defined by the points A, A', B, and B' as shown in FIG. 5.

Outside of the narrow region of the diode ring 54, the metal layer 26 is typically etched or otherwise formed so that the size of areas 50 and 51 is substantially large. However, those skilled in the art will readily understand that it is only necessary to maintain a minimum separation between the LO and RF coplanar waveguides so that the LO-to-RF isolation meets desired mixer 20 specifications. It is a matter of convenience in processing to have larger areas on the substrate 22 where there is no metal 26 deposited, but this is not necessary and depends on the specific manufacturing process employed.

FIG. 3 illustrates the construction of a via feedthrough 58 is a side view of the mixer 20. In FIG. 3, the via 58 provides a conductive path between the metal layer 26 and the bottom ground plane layer 24. This arrangement allows conductor 34 and ground 24 to be connected to the center contact and ground shield of a conventional coaxial connector for IF signal extraction and transfer. The via feedthrough 58 can be realized by drilling though the layer 26 and substrate 22 and filling the resulting passage with conductive epoxy or solder type materials. The conductive via 58 can also be realized by a conventional MMIC fabrication process readily available to those skilled in the art.

Lower IF frequency signals, which are produced by the interactions between the RF and LO signals on the diode ring 54, produce the same electrical potential across the slotlines 28 and 29. In other words, both edges of each slotline carry identical electrical charges at IF frequencies, but opposite electrical charges at RF and LO frequencies. This phenomenon produces a desirable inherent isolation between the IF and LO/RF signals. Due to the folded arrangement of the diode ring 54, during one-half cycle of the IF signals, both edges of the slotline 28 carry positive IF signal charges while both edges of the slotline 29 carry negative IF signal charges. During the next half-cycle, this order is reversed. At the IF frequencies, the charges are not confined to the area near the edges of the slotline but are spread out over the entire conductive surface areas 46 and 48. Therefore, the large conductive surfaces 46 and 48 behave as two electrodes for IF signals. IF signals can be extracted from the mixer 20 by tapping to any point on these surfaces.

The higher frequency LO and RF signals, however, are strictly confined to the slots of the slotlines 28 and 29. They are terminated at one end by the diodes and the other end by the large circular openings.

Figure 6:
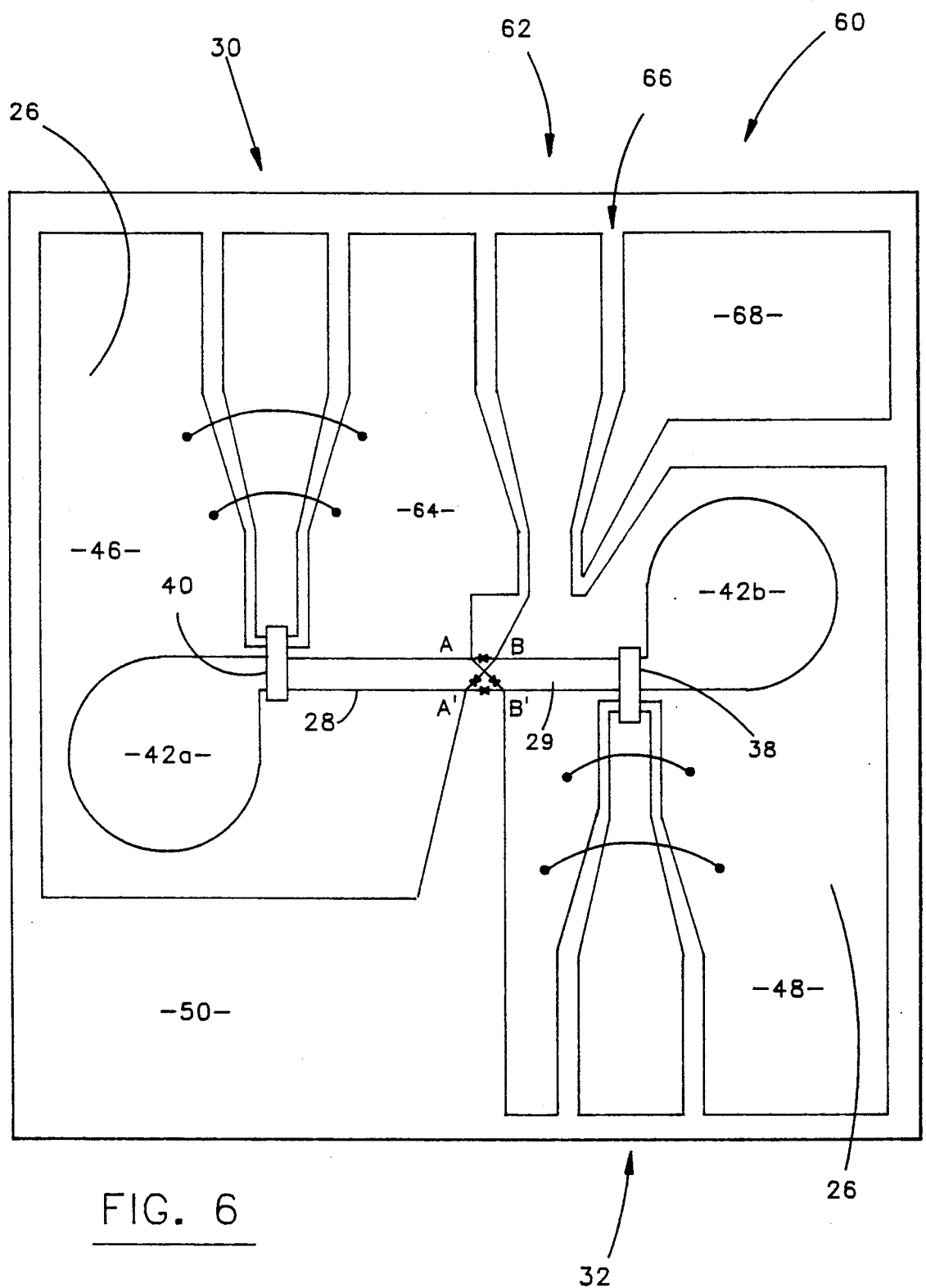
FIG. 6 illustrates an alternate embodiment for the mixer of FIG. 2.

The interesting characteristics of the DBM 20 described thus far allow an alternate embodiment for the IF signal extraction which is shown in FIG. 6 and is discussed in more detail below.

To prevent stray eddy currents and assure uniform frequency ground for the coplanar waveguides, a series of one or more electrical crossovers or conductive elements 52 are generally provided across the center feed lines of the coplanar waveguides 30 and 32. Exemplary conductors are gold ribbons, bond wires, air bridges or other connectors which span the waveguides.

The mixer 20 is further provided with four diodes D1-D4 which form the folded ring quad diode bridge or ring 54. The diode bridge 54 is illustrated in further detail in FIG. 5 and connects the diodes together in the same manner as shown in FIG. 1. For purposes of clarity, the diode connections or connection nodes are labeled as A, A', B, and B' to correspond to the connections of FIG. 1. This places two diodes, D1 and D3, substantially parallel to the sidewalls or length of the slotlines 28 and 29, and bridging the gap 56 between the slotlines or the conductive surfaces 46 and 48. The other two diodes, D2 and D4, extend across the widths of the slotlines 28 and 29, and the isolation gap 56 in a "X" shaped, criss-crossing, configuration.

To satisfy the required DBM configuration as illustrated in FIG. 1, both diodes D1 and D3 have their anodes connected to opposite edges of the slotline 29 and their cathodes connected to opposite edges of the slotline 28. The cathode of D4 is connected to the anode of D1, and the cathode of D2 is connected to the anode of D3. Also, the anode of D4 is connected to the cathode of D3 and the anode of D2 is connected to the cathode of D1 as shown in FIG. 5.

In FIG. 2, a position on the conductive surface 48 acts as a center tap of a transformer in the same manner as previously found in the transformer coils 16 in FIG. 1. The center tap for IF extraction, as in a conventional coiled transformer, is realized by connecting the conductors on the front side of the slotline. The ground paths adjacent to the coplanar waveguide gaps 36, of the waveguides 30 and 32 are connected together to form the mixer 20 RF and LO ground. A position on the conductive surface 48 between the waveguide 32 and the metal extending around the open slotline termination 42b is then chosen for the IF output connection. The exact position depends on the amount of inductance desired relative to the circuit positions B and B'. Those skilled in the art will readily understand that the selection of this position is similar to selecting the number of turns in the circuit of FIG. 1. This center tap connection becomes the IF output which is an ideal arrangement since it is located at the LO, or RF, virtual ground, assuring a high degree of LO-to-IF or RF-to-IF isolation. In order to facilitate IF signal extraction using a conventional coaxial connecter, one or more conductive vias 58 can be used to connect one or more IF electrodes, i.e., conductive surface 46, to conductive surface 24. Conductive surface 24 is then connected to the outer shield of a coaxial connector using a metallic supporting structure.

Since there are no strongly frequency dependent elements in the mixer 20, it is a very broadband device. Due to its passive operation, the DBM 20 should be unconditionally stable at all temperatures. The double-balanced mixer 20 also has excellent LO-to-RF, LO-to-IF, and RF-to-IF isolation due to the nature of the diode and balun configurations. However, the electrical configuration of the center tap for IF output generally limits application of the mixer 20 to IF frequencies of less than about 5 GHz to ensure good performance.

In FIG. 2, the IF output is extracted from the mixer 20 through the metal layer 26 on the RF side of the mixer 20, or conductive surface 48. For use in a monolithic integrated circuit chip, the IF ground is connected to the bottom ground plane 24 of the mixer 20 by a conductive via 58. Since the IF output point 34 coincides with the virtual ground of the LO signal, that is, the LO ground is the center tap of the IF output, LO-to-IF isolation is very high. The same is true for the RF-to-IF isolation. Unfortunately, the use of conductive vias in some applications is undesirable since this technique may introduce mechanical reliability or fabrication problems.

An alternate approach is shown in the top view of FIG. 6, where no conductive via for IF ground connection is necessary. In the embodiment of FIG. 6, the IF output is now extracted from a double-balanced mixer circuit 60 through a coplanar waveguide 62. The role of the bottom ground plane for the substrate 22, and, therefore the layer 24, can be eliminated in this approach.

In FIG. 6, the IF output is the center strip of a coplanar waveguide 62 that is formed on the top lateral ground 48 which is connected to the RF coplanar waveguide 32. The IF ground, which is the ground of the IF coplanar waveguide 62, is realized by extending the lateral ground 64 of the LO coplanar waveguide, or circuit 30, which is the center tap for the IF ground, close to the IF waveguide 62 center strip. This also results in an additional area of metallization 68 on the other side of the waveguide 62 and gaps 66 to complete the formation of the coplanar waveguide 62. As before, those skilled in the art will readily understand the dimensions required for the width of the gaps 66 in the waveguide 62 (which determines the coplanar waveguide impedance), to transfer desired frequencies.

As shown earlier in FIG. 2, gold ribbons, wires, or air bridge connectors are formed across the center conductor of the IF waveguide 62 to maintain proper ground connection and potential levels. The folded ring diode structure used to complete the mixer 60 is the same as that shown in FIG. 5 above.

An advantage of the embodiment of FIG. 6 is that the RF and LO inputs are interchangeable, as should be true in any ring DBM. That is, in this three coplanar waveguide structure, LO and RF signals can be introduced to either of the waveguides 30 or 32, with the other signals using the other waveguide. This electrical symmetry allows improved mixer application in a more flexible circuit design environment.

Figure 7B:
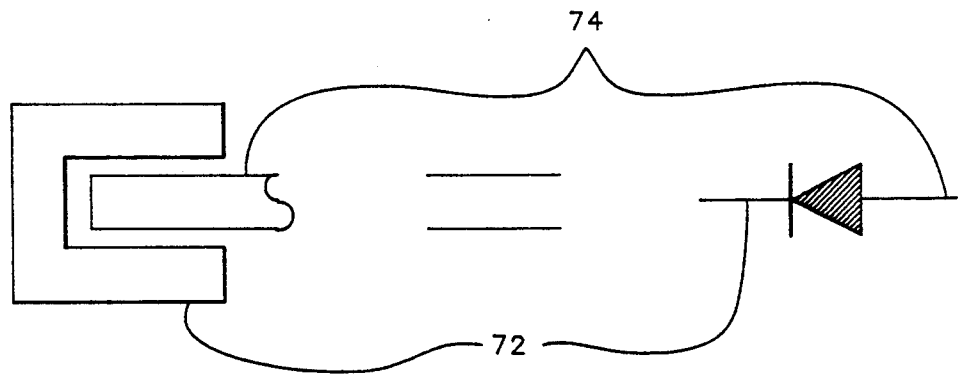
FIGS. 7A–7B illustrate an alternate diode bridge structure useful for MMIC fabrication of the mixer of FIGS. 2 and 6.

In keeping with the uniplanar design of the mixers 20 or 60, it should be noted that the diode bridge 54 can be implemented using either discrete or formed-in-place components. That is, the mixers 20 or 60 can be fabricated using conventional MMIC or semiconductor processing steps with the diodes being formed on the substrate 22 during those steps or added later. An exemplary embodiment illustrating the application of formed-in-place diodes is illustrated in FIGS. 7a and 7b.

Those skilled in the art are familiar with the appropriate types of semiconductor materials and dimensions required to form the diodes which depend on the applications for which the mixers 20 and 60 are designed. The illustrated diode structures are for purposes of clarity only and do not limit the application of alternate structures within the teachings of the invention. The diode structures of FIGS. 7a and 7b are illustrated as using generally square borders and right angles as a result of the growth patterns found in most semiconductor materials. It will be readily apparent that the diodes can be repositioned at angles to the slotlines if the fabrication process allows for repositioning the substrate.

Figure 7A:
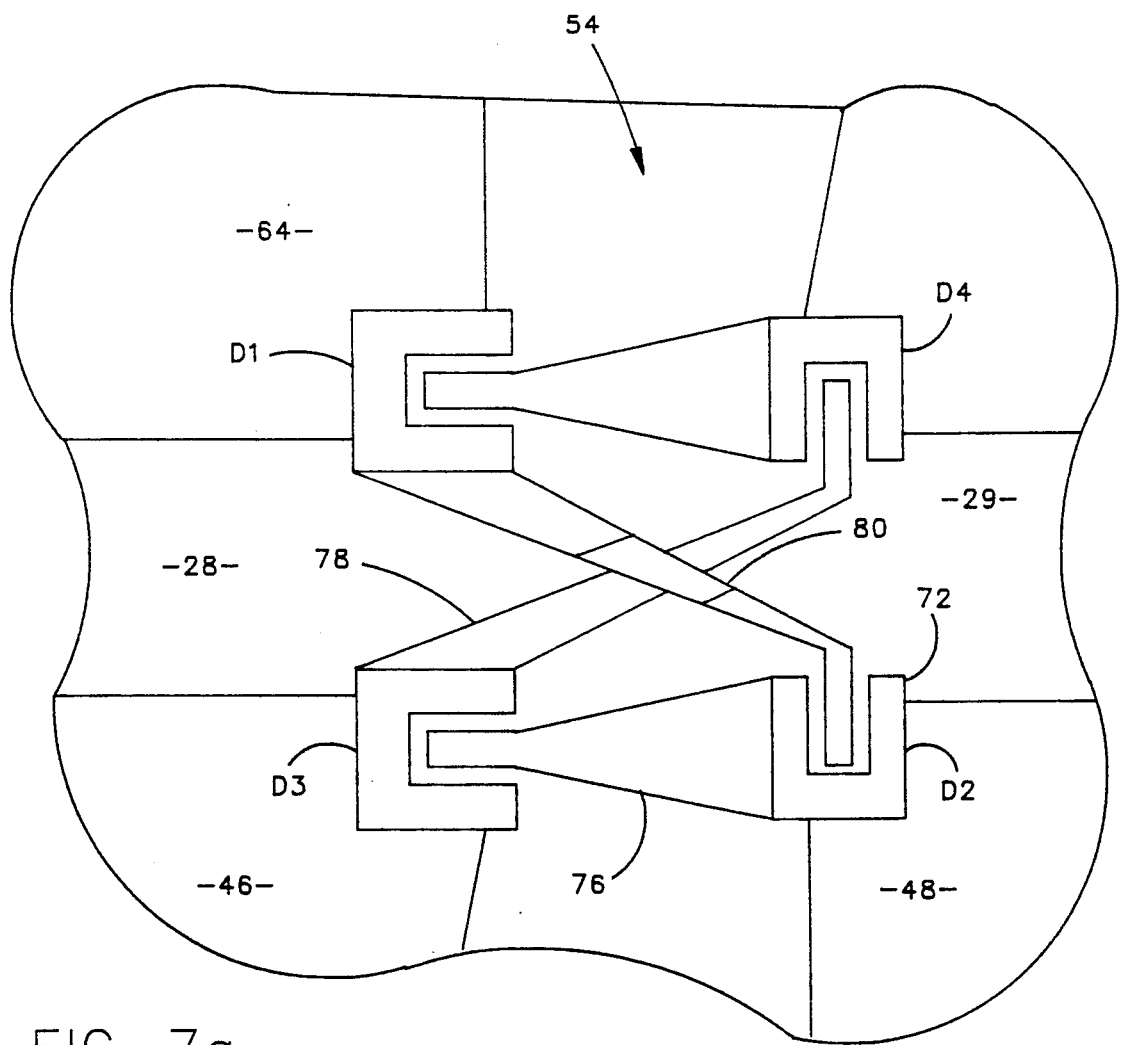

In FIG. 7a, an appropriate amount of $N^+$-type junction semiconductor material and ohmic metal 72 are deposited in recesses in, or layers over, the edges of the metal sidewalls of the slotlines 28 and 29 where they meet. The material 72 is deposited with a recess or passage into which an appropriate Schottky (or N-type) junction material 74 is then deposited. The correlation of the material deposition pattern with a standard diode circuit symbol employed in the art is presented in FIG. 7b. In FIG. 7b the diode cathode is illustrated as a generally U-shaped structure of $N^+$-type semiconductor material and ohmic metal which surrounds an anode of N-type (or Schottky) material.

The N-type material 74 is deposited to extend between the $N^+$-type material 72 depositions for the diodes D1, D2, D3, and D4 at adjacent slotline locations to interconnect the anodes and cathodes as previously described. This interconnection forms a generally straight line deposition pattern 76 between the diode pairs D1/D4 and D2/D3. However, the interconnection between the diode pairs D1/D2 and D3/D4 requires an angular deposition pattern 78 and a conductive crossover 80. The crossover 80 uses an air bridge type connection, preferably, or ribbon conductor to connect diode $D_1$ to $D_2$.

The RF, LO, and IF outputs of the mixer 60 are all coplanar which allows monolithic fabrication using conventional semiconductor manufacturing techniques and facilitates evaluation of the mixer 20, or 60, structure using probes. This invention is ideal for many applications where low cost, small size, and high performance broadband double-balanced mixers are required. The invention can satisfy extensive requirements in a variety of communication, MMIC, radar, and missile sensor systems.

The foregoing description of preferred embodiments has been presented for purposes of illustration and description. It is not intended to be exhaustive nor to limit the invention to the precise forms disclosed, and many modifications and variations are possible in light of the above teaching. The embodiments were chosen and described to best explain the principles of the invention and its practical application to thereby enable others skilled in the art to best utilize the invention in various embodiments and with various modifications as are suited to the particular use contemplated. It is intended that the scope of the invention be defined by the claims and their equivalents.

What I claim as my invention is:

1. A passive uniplanar double-balanced mixing apparatus, comprising:
   a substantially planar support substrate;
   a first conductive layer of material disposed on a first side of said substrate;
   a second conductive layer of material disposed on a second side of said substrate;
   a linear first slotline conductor of predetermined with and length formed in said first conductive layer and having an open termination adjacent a first end;
   a linear second slotline conductor of predetermined width and length formed in said first conductive layer adjacent to said first slotline conductor and having an open termination adjacent a first end;
   a first coplanar waveguide formed in said first conductive layer having one end electrically coupled to said first end of said first slotline conductor, being configured to transfer signals of a first preselected frequency range;
   a second coplanar coaxial waveguide formed in said first conductive layer having one end electrically coupled to said first end of said second slotline conductor, being configured to transfer signals of a second preselected frequency range;
   first baluns means positioned adjacent said first coplanar waveguide and said first end of said slotline conductor for converting said unbalanced transmission line of said first coplanar waveguide to a balanced transmission line of said first slotline, being connected so that a ground of said first coplanar waveguide comprises a ground for said mixer at said first signal frequency;
   second baluns means positioned adjacent said second coplanar waveguide and said first end of said second slotline conductor for converting said unbalanced transmission line of said second coplanar waveguide to a balanced transmission line of said second slotline, being connected so that a ground of said second coplanar waveguide comprises a ground for said mixer at said second frequency;
   isolation means disposed in said first conductive layer adjacent said slotline conductors for providing electrical isolation between said first and second baluns means and waveguides;
   transfer means connected to said grounds adjacent to but removed a predetermined distance from said waveguides for transferring intermediate oscillator frequency signals of predetermined frequency; and
   a folded diode ring positioned between said first and second slotline conductors comprising first, second, third, and fourth diodes.

2. The double-balanced mixer of claim 1 wherein said folded diode ring comprises:
   a first diode connected at its anode to said first slotline adjacent to said first balun and at its cathode to said second slotline adjacent to said second balun;
   a second diode connected at its anode to said second slotline adjacent to said second balun and at its cathode to said first slotline adjacent to said first balun;
   a third diode connected at its anode to said first slotline adjacent to said first balun and at its cathode to said second slotline adjacent to said second balun; and
   a fourth diode connected at its cathode to said first slotline adjacent to said first balun and at its anode to said second slotline adjacent said second balun.

3. The double-balanced mixer of claim 1 wherein said first waveguide comprises an RF input/output port and said second waveguide comprises a local oscillation frequency input port and said transfer means comprises an intermediate frequency output port in the form of a conductive via connected to said second balun.

4. The double-balanced mixer of claim 1 wherein said isolation means comprises a break in said first conductive material layer between said first and second waveguides.

5. The double-balanced mixer of claim 1 wherein said first and second open terminations comprise circular openings of predetermined radius in said first conductive layer.

6. The double-balanced mixer of claim 1 wherein said conductive layers comprise material chosen from the group of gold, chrome/gold alloy, and silver.

7. The double-balanced mixer of claim 1 wherein said substrate comprises gallium arsenide.

8. The double-balanced mixer of claim 1 wherein said substrate comprises of insulating material.

9. The double-balanced mixer of claim 8 wherein said material comprises sapphire.

10. The double-balanced mixer of claim 8 wherein said material comprises ceramic.

11. The double-balanced mixer of claim 1 further comprising a plurality of electrically conductive crossovers positioned so as to span said waveguides and provide ground potential continuity across said waveguides.

12. A passive uniplanar double-balanced RF mixing apparatus, comprising:
   a substantially planar support substrate;
   a conductive layer of material disposed on a first side of said substrate;

a first slotline formed in said conductive layer having an open termination adjacent a first end;

a second slotline formed in said first conductive layer adjacent to said first slotline conductor and having an open termination adjacent a first end;

a first coplanar waveguide formed in said conductive layer having one end electrically coupled to said first end of said first slotline, being configured to transfer radio frequency signals of a first predetermined frequency range;

a second coplanar coaxial waveguide formed in said conductive layer having one end electrically coupled to a first end of said second slotline, and being configured to transfer signals of a second predetermined frequency range;

first baluns means positioned adjacent to said first coplanar waveguide, said first end of said first slotline, and one of said open terminations;

second baluns means positioned adjacent to said second coplanar waveguide, said first end of said second slotline, and the other one of said open terminations;

a third coplanar waveguide formed in said conductive layer having one end electrically coupled to one of said baluns means adjacent one of said slotlines and removed a predetermined distance from a waveguide and being configured to transfer intermediate oscillator frequency signals of predetermined frequency range;

isolation means disposed in said conductive layer adjacent and between said first and second slotlines for providing electrical isolation between said first and second balus means and waveguides; and a folded diode ring positioned between said first and second slotlines and electrically connected to said first and second slotlines, and comprising first, second, third, and fourth diodes.

13. The double-balance RF mixer apparatus of claim 12 wherein said folded diode ring comprises:

a first diode connected at its anode to said first slotline adjacent to said first balun connection to said first coplanar waveguide and at its cathode to said second slotline adjacent said second balun connection to said second coplanar waveguide;

a second diode connected at its anode to said second slotline adjacent to said second balun connection to said second coplanar waveguide and at its cathode to said first slotline adjacent said first balun connection to said first coplanar waveguide;

a third diode connected at its anode to said first slotline adjacent said first balun connection to said first coplanar waveguide and at its cathode to said second slotline adjacent said second balun connection to said second coplanar waveguide; and a fourth diode connected at its anode to said second slotline adjacent said second balun connection to said second coplanar waveguide and at its cathode to first slotline adjacent to said first balun connection to said first coplanar waveguide.

14. The double-balanced RF mixer apparatus of claim 13 wherein said first coplanar waveguide comprises an RF input/output port, said second waveguide comprises a local oscillator frequency input port, and said third coplanar waveguide has one end connected to said second baluns means adjacent said second slotline on an opposite side of said second slotline drom said second waveguide.

15. The double-balanced RF mixer apparatus of claim 13 wherein said isolation means comprises an isolation gap in said conductive layer between said first and second waveguides and baluns.

16. The double-balanced RF mixer apparatus of claim 13 wherein said first and second open terminations comprise circular openings of predetermined radius in said conductive layer.

17. The double-balanced RF mixer apparatus of claim 13 wherein said substrate comprises gallium arsenide.

18. A passive uniplanar double-balanced ring-type mixer, comprising:

a substantially planar base substrate;

a first linear slotline of predetermined width and length disposed on a first surface of said substrate and being terminated on a first end in an open termination and on a second end in a folded diode ring;

a second linear slotline of predetermined width and length disposed on a first surface of said substrate adjacent to said first slotline and being terminated on a first end in an open termination and on a second end in said folded diode ring;

a first coplanar waveguide disposed on said first surface of said substrate having one end electrically coupled to said first end of said first slotline and a second end configured to transfer signals between said first waveguide and other apparatus;

a first coplanar waveguide-to-slotline balun disposed on said first surface adjacent to and between said first coplanar waveguide and said slotline first ends;

a second coplanar waveguide disposed on said first surface of said substrate having one end electrically coupled to a first end of said second slotline and a second configured to transfer signals between said second waveguide and other apparatus;

a second coplanar waveguide-to-slotline balun disposed on said first surface adjacent to and between said second coplanar waveguide and said second slotline first end;

extraction means disposed on said first surface of said substrate having one end electrically coupled to one of said baluns adjacent one of said slotlines and removed a predetermined distance from a waveguide associated with said balun for transferring intermediate oscillator frequency signals of predetermined frequency range; and a folded diode ring positioned between said first and second slotlines and electrically connected to said first and second baluns comprising first, second, third, and fourth diodes wherein said:

first diode is connected at its anode to the first slotline adjacent to the first balun and at its cathode to the second slotline adjacent to the second balun;

second diode is connected at its anode to the second slotline adjacent to the second balun and at its cathode to the first slotline adjacent to the first balun;

third diode is connected at its cathode to the second slotline adjacent to the second balun and at its anode to the first slotline adjacent to the first balun; and fourth diode is connected at its cathode to the first slotline adjacent to the first balun and at its anode to the second slotline adjacent to the second balun.

19. The double-balanced mixer apparatus of claim 18 further comprising:

a third coplanar waveguide disposed on said first surface of said substrate having one end electrically coupled to one of said baluns adjacent one of said slotlines and removed a predetermined distance from a waveguide associated with said balun and having a second end configured to transfer intermediate oscillator frequency signals of predetermined frequency range to other apparatus.

20. The double-balanced mixer apparatus of claim 18 wherein said substrate comprises gallium arsenide.

21. The double-balanced mixer apparatus of claim 18 wherein said substrate comprises insulating material.

22. The double-balanced mixer apparatus of claim 18 wherein said first and second baluns comprise a conductive layer of material disposed on said substrate, said metal having isolation passages formed therein for said waveguides, and circular passages defining said open terminations, and narrow rectangular openings defining said slotlines.

23. The double-balanced mixer apparatus of claim 18 wherein said first, second third and fourth, diodes each comprise a layer of N-type semiconductor material disposed on said substrate at an edge of one of said slotlines in electrical contact with one of said baluns and a layer of $N^+$-type material deposited in contact therewith, said $N^+$-type material extending from one of said diodes to the N-type material of a second diode to which an anode of the first diode is to contact.

* * * * *